US009529017B2

(12) United States Patent
Martin et al.

(10) Patent No.: US 9,529,017 B2
(45) Date of Patent: *Dec. 27, 2016

(54) TEST AND MEASUREMENT INSTRUMENT AND METHOD OF SWITCHING WAVEFORM DISPLAY STYLES

(71) Applicant: TEKTRONIX, INC., Beaverton, OR (US)

(72) Inventors: Gregory A. Martin, Portland, OR (US); David D. Farrell, Tualatin, OR (US); Evan A. Dickinson, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 241 days.

This patent is subject to a terminal disclaimer.

(21) Appl. No.: 14/178,684

(22) Filed: Feb. 12, 2014

(65) Prior Publication Data

US 2014/0160144 A1    Jun. 12, 2014

Related U.S. Application Data

(62) Division of application No. 12/491,999, filed on Jun. 25, 2009, now Pat. No. 8,818,744.

(60) Provisional application No. 61/105,922, filed on Oct. 16, 2008.

(51) Int. Cl.
 *G06T 11/20* (2006.01)
 *G01R 13/02* (2006.01)
 *G09G 5/02* (2006.01)

(52) U.S. Cl.
 CPC .......... *G01R 13/02* (2013.01); *G01R 13/0227* (2013.01); *G06T 11/203* (2013.01); *G09G 5/02* (2013.01)

(58) Field of Classification Search
 USPC .......................................................... 702/68
 See application file for complete search history.

(56) References Cited

U.S. PATENT DOCUMENTS

| 4,183,087 A | 1/1980 | Huelsman |
| 4,271,486 A | 6/1981 | Dagostino |
| 4,586,022 A | 4/1986 | Acuff |

(Continued)

FOREIGN PATENT DOCUMENTS

| DE | 102007053401 A1 | 5/2009 |
| EP | 1837665 A2 | 9/2007 |
| WO | 2008064752 A1 | 6/2008 |

OTHER PUBLICATIONS

Matthew S. Holcomb, Design of a Mixed-Signal Oscilloscope, Apr. 1997 Hewlett-Packard Journal, p. 1-11.*

(Continued)

*Primary Examiner* — Tung Lau
(74) *Attorney, Agent, or Firm* — Michael A. Nelson; Marger Johnson (57) ABSTRACT

A test and measurement instrument and method of switching waveform display styles includes acquiring an electrical signal, storing peak detect data samples from the electrical signal to one or more memory devices, storing filtered data samples or unfiltered data from the electrical signal, automatically switching to a first waveform display style having the peak detect data samples configured in a first mode when a user selects the unfiltered data, and automatically switching to a second waveform display style having the peak detect data samples configured in a second mode when the user selects the filtered data samples.

11 Claims, 7 Drawing Sheets

(56) References Cited

U.S. PATENT DOCUMENTS

| | | | |
|---|---|---|---|
| 4,621,217 | A | 11/1986 | Saxe |
| 5,115,189 | A | 5/1992 | Holcomb |
| 5,115,404 | A | 5/1992 | Lo |
| 5,233,546 | A | 8/1993 | Witte |
| 5,547,232 | A | 8/1996 | Waterman |
| 5,740,064 | A | 4/1998 | Witte |
| 6,121,799 | A | 9/2000 | Moser |
| 6,344,844 | B1 | 2/2002 | Timm |
| 6,388,595 | B1 | 5/2002 | Edwards |
| 6,473,532 | B1 | 10/2002 | Sheraizin et al. |
| 6,693,576 | B2 | 2/2004 | Azinger |
| 7,834,780 | B2 | 11/2010 | Sullivan et al. |
| 2001/0016078 | A1* | 8/2001 | Go .................... G06T 9/20 382/240 |
| 2007/0217694 | A1 | 9/2007 | Sullivan et al. |
| 2008/0187235 | A1* | 8/2008 | Wakazono .......... H04N 5/243 382/255 |

OTHER PUBLICATIONS

Hogenauer, E.B., "An Economical Class of Digital Filters for Decimation and Interpolation.", IEEE Transactions on Acoustics, Speech and Signal Processing, ASSP-29 (2): 155-162, 1981.
Donadio, Matthew P., "CIC Filter Introduction", For Free Publication by lowegian, pp. 1-6, Jul. 18, 2000. Online at: http://users.snip.net/~donadio/cic.pdf.
Holcomb, Matthew S., "Design of a Mixed-Signal Oscilloscope," Apr. 1997, Hewlett-Packard Journal, pp. 1-11.

* cited by examiner

TEST AND MEASUREMENT INSTRUMENT AND METHOD OF SWITCHING WAVEFORM DISPLAY STYLES

CROSS REFERENCE TO RELATED APPLICATIONS

This application is a division of copending U.S. patent application Ser. No. 12/491,999, filed Jun. 25, 2009, which claims benefit of U.S. provisional application Ser. No. 61/105,922, filed Oct. 16, 2008, which are hereby incorporated by reference.

BACKGROUND

This disclosure relates to test and measurement instruments, in particular to test and measurement instruments and methods of switching waveform display styles of the same.

Test and measurement instruments can be used to display waveforms associated with information gathered from one or more electrical signals. For example, a conventional oscilloscope can acquire electrical signals through a particular channel, sample the electrical signals, and display the sampled information as a waveform or overlapped waveforms. In one scenario, the oscilloscope can sample peak detect data, or in other words, minimum and maximum values within successive periods of time and store these values in memory. In another scenario, the oscilloscope can apply lowpass filtering to the electrical signals and display the lowpass sampled data in parallel with the peak detect data. Commonly-owned US Patent Application Publication 2007/0217694 to Sullivan et al. (hereinafter "Sullivan"), filed Mar. 20, 2006, entitled, WAVEFORM COMPRESSION AND DISPLAY, which is herein incorporated by reference in its entirety, discloses such a system.

Sullivan teaches that two waveforms can be overlaid. For example, a foreground waveform (i.e., filtered waveform) can be overlaid with a background waveform (i.e., glitch capture waveform) so that both waveforms can be simultaneously observed. Traditionally, filtering has involved a tradeoff. The waveform the user is looking at becomes cleaner and easier to measure, but the user loses the ability to see noise and high-frequency glitches. Sullivan avoids that trade-off by letting the user see a filtered waveform along with the noise and glitches that were filtered out. But Sullivan does not disclose how best to display these signals, or how to control their display, including how to turn one or the other of them off.

SUMMARY

An embodiment is a test and measurement instrument comprising acquisition circuits configured to acquire one or more data streams, and to generate peak detect data samples from the one or more data streams; input circuits configured to receive input from a user to change an amount of lowpass filtering applied to the one or more data streams; and a display unit configured to change the intensity of pixels associated with the peak detect data samples based on the proximity to pixels associated with lowpass filtered data samples for a given channel. Waveforms associated with the filtered or unfiltered data samples may be overlaid on the related waveform associated with the peak detect data samples.

Some embodiments include a method of switching waveform display styles on a test and measurement instrument including acquiring an electrical signal; storing peak detect data samples from the electrical signal to one or more memory devices of the test and measurement instrument; storing filtered data samples or unfiltered data from the electrical signal to the one or more memory devices; automatically switching to a first waveform display style having the peak detect data samples configured in a first mode when the user selects the unfiltered data; and automatically switching to a second waveform display style having the peak detect data samples configured in a second mode when the user selects the filtered data samples.

Another embodiment includes a method of electrical signal acquisition and display, including digitizing the electrical signal to produce a data stream; compressing the data stream in parallel simultaneously using a plurality of compression schemes, at least one of the compression schemes being a lowpass filtering scheme, and at least another of the compression schemes being a peak detect compression scheme, to produce a compressed sampled data stream for each compression scheme; storing the compressed sampled data streams in one or more memory devices; generating a graphic waveform image associated with each of the compressed sampled data streams; receiving an input from a user to adjust the lowpass filtering scheme of the sampled data stream; and changing an appearance of the graphic waveform image associated with the peak detect compression scheme when the user adjusts the lowpass filtering scheme of the sampled data stream. The method may also include showing the graphic waveform image associated with the lowpass filtering scheme in a foreground of a display of a display device, and showing the graphic waveform image associated with the peak detect compression scheme in a background of the display of the display device.

Some embodiments include a method of displaying waveforms on a test and measurement instrument, including acquiring a first electrical signal on a first channel; acquiring a second electrical signal on a second channel; storing peak detect data samples for each of the channels to one or more memory devices of the test and measurement instrument; storing filtered data samples or unfiltered data for each of the channels to the one or more memory devices; displaying pixels having a first hue and first intensity that are associated with the filtered data samples or unfiltered data for the first channel; and displaying pixels having a second hue and second intensity that are associated with the peak detect data samples when a user selects the filtered data samples for the first channel.

DETAILED DESCRIPTION

Embodiments include, for example, test and measurement instruments and techniques of switching waveform display styles. In particular, in one embodiment, the test and measurement instrument automatically switches to a first waveform display style having peak detect data samples configured in a first mode when the user selects unfiltered data, and automatically switches to a second waveform display style having the peak detect data samples configured in a second mode when the user selects filtered data samples.

Figure 1:
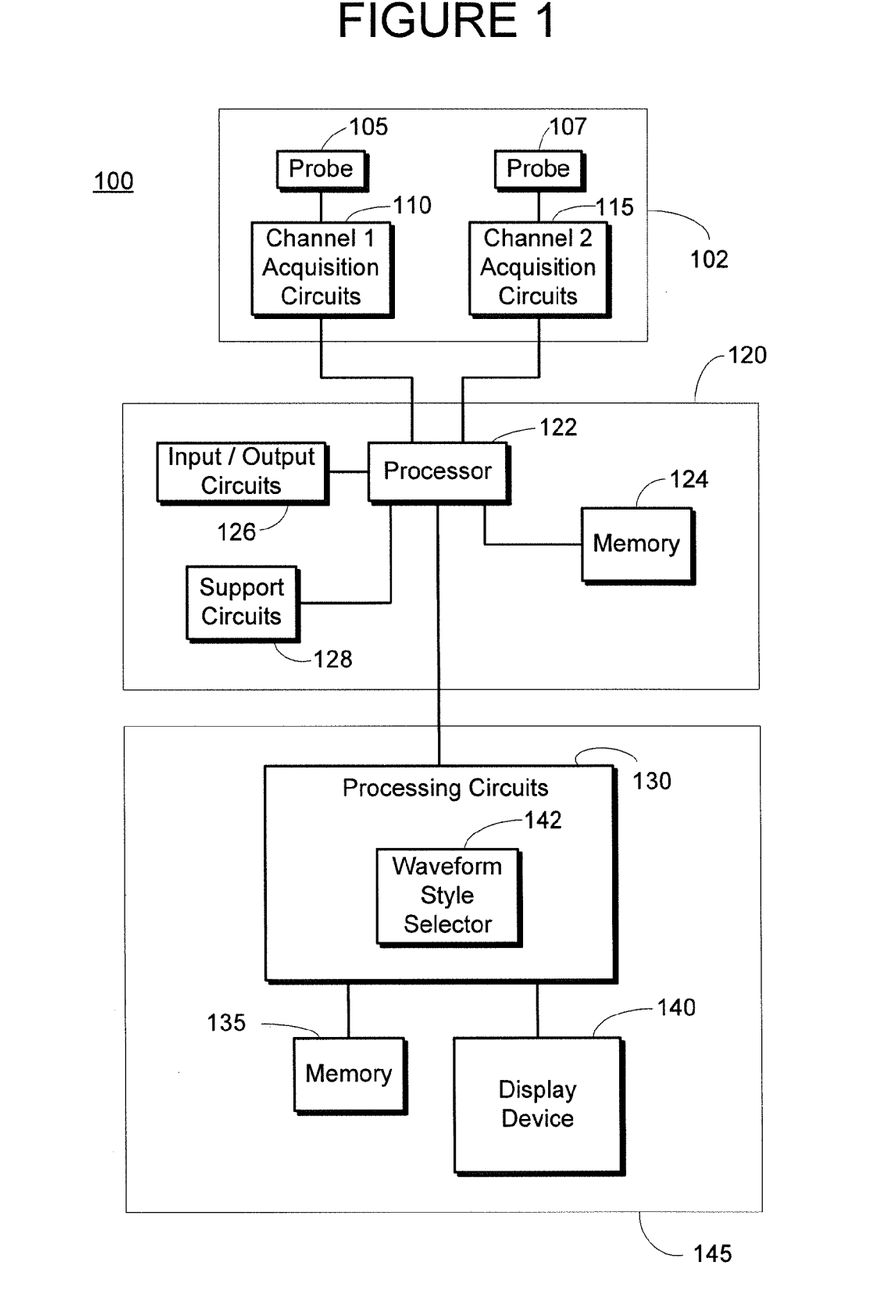
FIG. 1 is a block diagram of a test and measurement instrument including an acquisition unit, a controller, and a display unit having a waveform style selector according to an embodiment.

FIG. 1 is a block diagram of a test and measurement instrument 100 including an acquisition unit 102, a controller 120, and a display unit 145. The display unit 145 may have a waveform style selector 142. The test and measurement instrument 100 may be an oscilloscope, for example, and for the sake of brevity but not limitation, will generally be referred to as such. The oscilloscope 100 may have two channels suitable for use with various embodiments as described herein. Although a two-channel oscilloscope is shown, inventive aspects described are equally applicable to an oscilloscope having four channels, or any number of channels.

The acquisition unit 102 of the oscilloscope 100 may include a first probe 105 operatively associated with acquisition circuits 110 and a second probe 107 operatively associated with acquisition circuits 115. The probe 105 and the probe 107 may be any conventional voltage or current probes suitable for respectively detecting one or more electrical signals, such as analog voltage or current signals from a circuit under test (not shown). For example, the probes 105 and 107 may be provided by Tektronix®, Inc., such as active probe model numbers P1075, TCP105, among others, which may be used to acquire real time electrical signal information. The output signals of probes 105 and 107 are sent to the channel 1 acquisition circuits 110 and the channel 2 acquisition circuits 115, respectively. The acquisition circuits 110 and 115 sample and digitize the one or more electrical signals and store sampled data streams in memory, among other functions, as will be later described in further detail below. The acquisition unit 102 may be operatively coupled to the controller 120.

The controller 120 is operatively coupled to the acquisition circuits 110 and 115, and the display unit 145, and processes the sampled data streams provided by the acquisition circuits 110 and 115 for display by the display unit 145. For example, given desired time per division and volts per division display parameters of the oscilloscope 100, the controller 120 may modify and then rasterize the raw data associated with an acquired sample data stream to produce a corresponding waveform image having the desired time per division and volts per division parameters. The controller 120 may also normalize waveform data having non-desired time per division, volts per division, and current per division parameters to produce a waveform image having the desired parameters.

The controller 120 preferably includes a processor 122, support circuits 128, input/output (I/O) circuits 126, and memory 124. The processor 122 is operatively coupled to the acquisition circuits 110 and 115. As such, it is contemplated that some of the processes discussed herein may be implemented as software processes in processor 122, and some of the processes discussed herein may be implemented within hardware, for example, as circuitry that cooperates with processor 122 to perform various functions. In addition, some of the processes discussed herein may be implemented using a combination of software, hardware, firmware, or other execution or storage means. The I/O circuits 126 may form an interface between the various elements communicating with the controller 120. For example, the I/O circuits 126 may comprise an interconnection to a keypad, pointing device, touch screen, external PC, or other peripheral devices adapted to provide user input and output to controller 120. The controller 120, in response to such user input, may control the operations of the acquisition circuits 110 and 115 to perform various functions, in particular filtering or other compression operations, but also including such operations as data acquisitions or processing, among other possibilities. In addition, the user input may be used to trigger automatic calibration functions or provide control for other components included in, for example, the display unit 145.

The memory device 124 may include volatile memory, such as SRAM, DRAM, among other volatile memories. The memory device 124 may also include non-volatile memory devices, such as a disk drive or a tape medium, among others, or programmable memory, such as an EPROM, EEPROM, or flash memory, among other possibilities.

Although the controller 120 of FIG. 1 is depicted as a general purpose computer or microprocessor that is programmed to perform various control functions in accordance with embodiments of the present invention, the embodiments may be implemented in hardware such as, for example, an application specific integrated circuit (ASIC). As such, it is intended that the processor 120, as described herein, be broadly interpreted as being equivalently performed by hardware, software, or by any combination thereof.

It will be appreciated by those skilled in the art that standard signal processing components (not shown), such as signal buffering circuitry, signal conditioning circuitry, display drivers, and the like are also employed as required to enable the various interface functions described herein. For example, the acquisition circuits 110 and 115 sample the electrical signals under test at a sufficiently high rate to enable appropriate processing by the controller 120 or the processing circuits 130 of the display unit 145. In this regard, the acquisition circuits 110 and 115 may sample their respective input electrical signals in accordance with a sample clock provided by an internal sample clock generator (not shown), which may be a part of, for example, the support circuits 128.

Controller 120 provides the waveform data to the display unit 145. The display unit 145 includes processing circuits 130 for subsequent presentation of the waveform data on a display device 140. The processing circuits 130 may include data processing circuitry suitable for converting acquired data streams or waveform data into video images or video signals, which are adapted to provide visual imagery (e.g., video frame memory, display formatting and driver circuitry, and the like). The processing circuits 130 may interface with a memory 135, also included in the display unit 145, which may be arranged in memory planes, and may be configured to store the video images, among other possibilities. The processing circuits 130 and/or the memory 135 provide output signals suitable for use by a display device 140. User input received through I/O circuits 126 may be used to adjust an amount of filtering to be applied to the sampled data streams, to trigger automatic calibration functions, or to adapt other operating parameters of the processing circuits 130 and of display device 140. The display device 140 may be configured to display the video images and to switch waveform display styles responsive to the user input selection between lowpass filtered data samples and unfiltered data from among the data streams, as will further be described in detail below.

The processing circuits 130 may include a waveform style selector 142. While the waveform style selector 142 is shown as part of the processing circuits 130, it should be understood that the waveform style selector 142 may be located elsewhere among other components of the oscilloscope 100. For example, the controller 120 or the acquisition unit 102 may include the waveform style selector 142, among other possibilities. The waveform style selector 142 may be implemented by hardware, software, or by any combination thereof. The waveform style selector 142 will be further described in detail below with reference to FIGS. 3-9.

Figure 2:
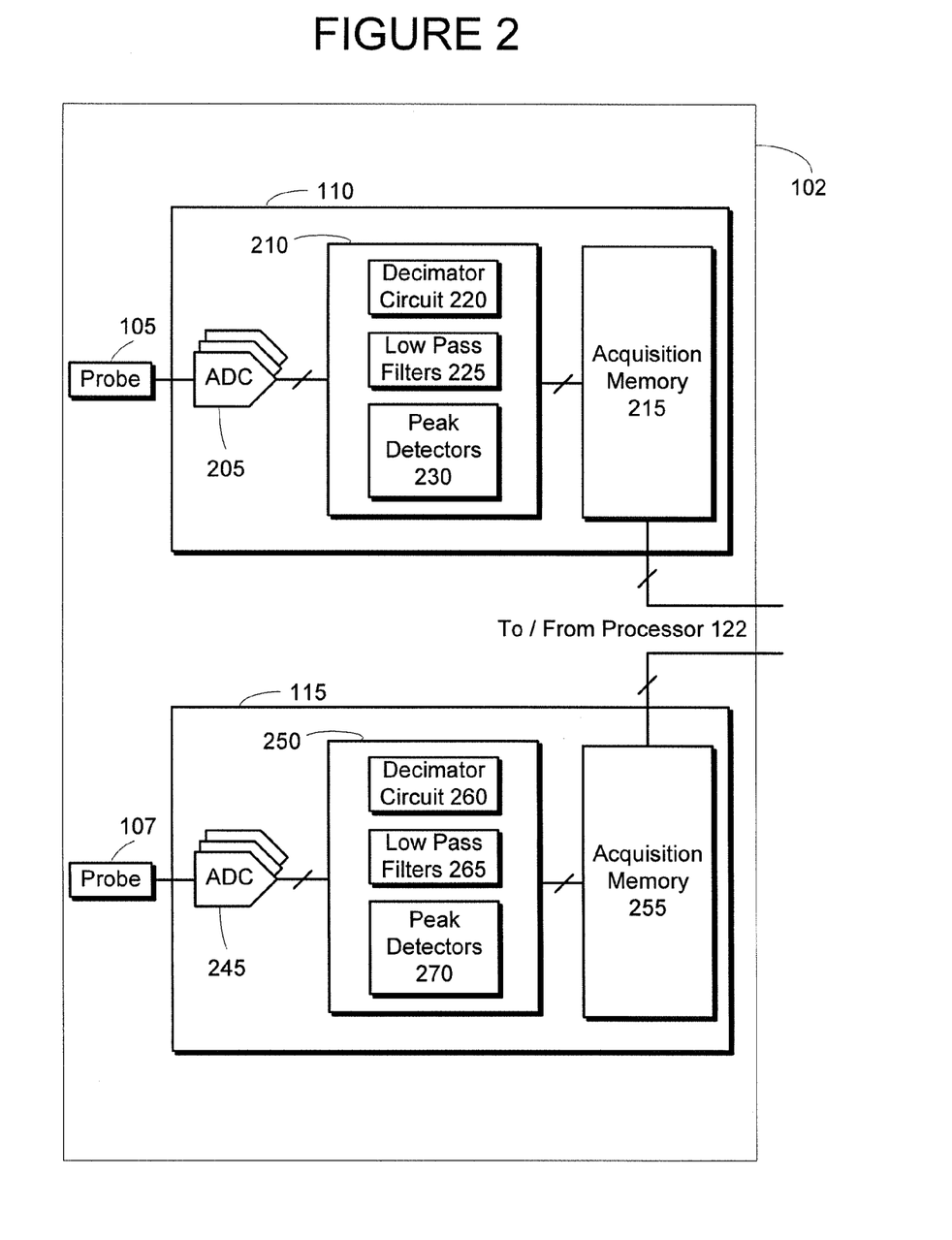
FIG. 2 is a block diagram illustrating additional elements of the acquisition unit of FIG. 1.

FIG. 2 is a block diagram illustrating additional elements of the acquisition unit 102 of FIG. 1 according to an embodiment. The acquisition unit 102 may include circuitry for one or more channels. Although the circuitry for only two channels is shown, the oscilloscope 100 may have any number of channels and associated components. Each channel has associated therewith acquisition circuits (e.g., 110 and 115). The acquisition circuits include analog-to-digital converters (ADCs) (e.g., 205 and 245), which collectively sample the electrical signals received through the respective probes (e.g., 105 and 107). The ADCs deliver data streams to a sampler (e.g., 210 and 250). The sampler may include a decimator circuit (e.g., 220 and 260), lowpass filters (e.g., 225 and 265), and peak detectors (e.g., 230 and 270), among other possible components.

The peak detectors generate peak detect data samples by finding the maximum and minimum values within successive periods of time, and may store these values in one or more memory devices (e.g., 215 and 255). The lowpass filters remove high frequency components of the electrical signals, and may generate lowpass filtered data samples to be stored in the one or more memory devices. The decimator circuit provides a form of compression by discarding samples. For example, to compress by a factor of ten, the decimator circuit just discards nine out of every ten samples. (Other fractions, such as one of eight samples, can be used.) Any one or more of the peak detectors, lowpass filters, and decimator circuits may be applied in parallel simultaneously to the data streams to produce peak detect data samples, filtered data samples, and/or compressed data. In some embodiments, for example, only the peak detectors and the decimator circuits are used to modify the data streams, while leaving the data streams unfiltered. In other embodiments, the lowpass filters are applied to the data streams to produce the filtered data samples, which may also be decimated or otherwise further compressed. In still other embodiments, the decimator circuits compress at least some of the unfiltered data and the filtered data samples. In any case, the resulting samples, whether filtered or unfiltered, compressed or not compressed, may be stored in the one or more memory devices, and used with the various embodiments discussed herein. Graphic waveforms may then be generated that are associated with each of the sampled data streams.

Although the decimator circuits, lowpass filters, and peak detectors are shown as individual circuits, they may be designed as a single unit, or for example, two units. The peak data samples may be "tagged" as background data for display and the decimated or lowpass filtered data may be "tagged" as foreground data for display. The peak detect data samples, in addition to providing information about the peak-to-peak signal amplitude, may be viewed as warning information such as warning that a narrow pulse occurred, a high frequency signal is present, or that the dynamic range of the ADCs is being exceeded. The information stored in the acquisition memory devices (e.g., 215 and 255) may be transmitted to the processor 122 (of FIG. 1). In addition, the processor 122 may transmit control information to the acquisition unit 102.

Figure 3:
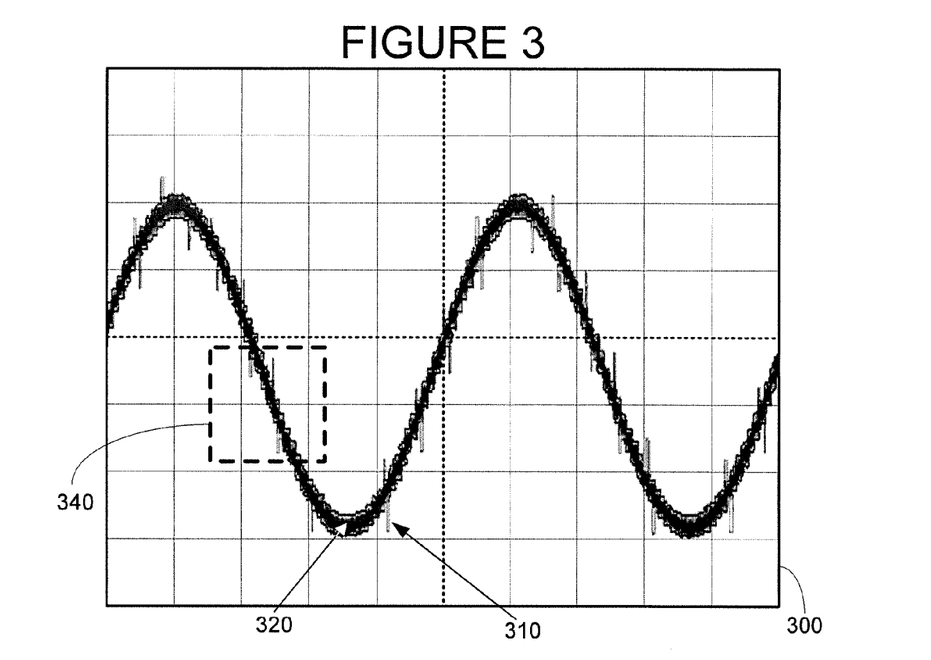
FIG. 3 is an example plot of a sampled electrical signal showing waveforms having unfiltered data and peak detect data samples according to an embodiment.
Figure 4:
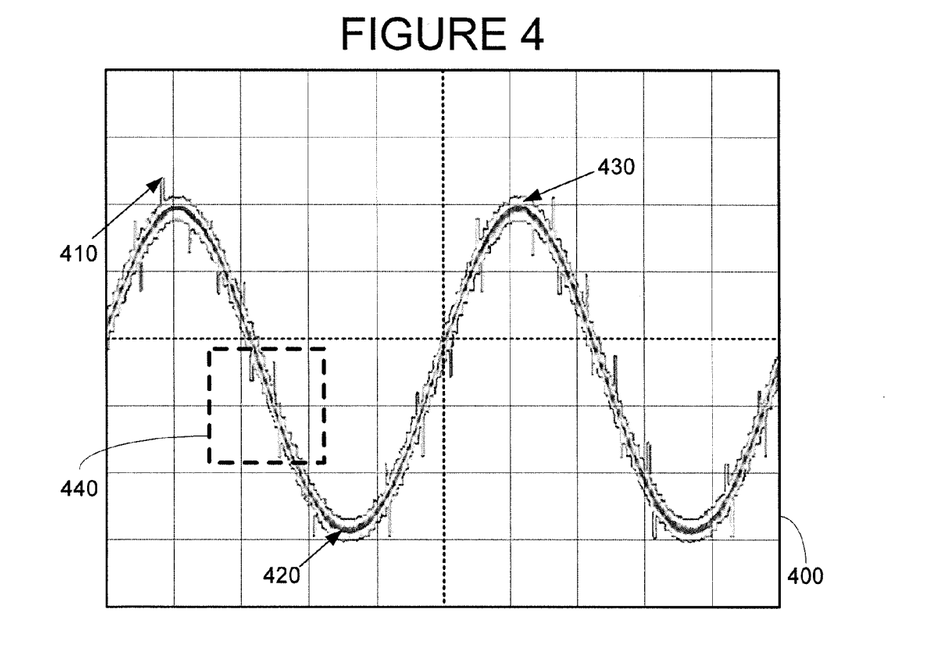
FIG. 4 is an example plot of a sampled electrical signal showing waveforms having filtered data samples and peak detect data samples according to an embodiment.

FIG. 3 is an example plot 300 of a sampled electrical signal showing waveforms having unfiltered data 320 and peak detect data samples 310 according to an embodiment. FIG. 4 is an example plot 400 of a sampled electrical signal showing waveforms having filtered data samples 420 and peak detect data samples 410 according to an embodiment. The following description will now be given with reference to both of FIGS. 3 and 4.

Traditionally, filtering waveforms on an oscilloscope has involved a trade-off. The waveform the user is looking at becomes cleaner and easier to measure, but the ability of the user to see noise and high-frequency glitches is diminished or lost. As mentioned above, Sullivan discloses a technique for displaying a foreground filtered waveform overlaid with a background glitch capture waveform. In this manner, both waveforms can be viewed simultaneously, which is more useful than a single filtered waveform.

However, a certain kind of users may want the oscilloscope to draw waveforms in a way that is similar to the way oscilloscopes traditionally operate. This category of users would not particularly care about the glitch capture background or other peak data samples, and would not want to think about the difference between the foreground and background waveform. Another kind of users may want the ability to see both filtered data and glitch data on the display and be able to differentiate between the foreground and background waveforms. It is important to these users that the two waveforms are visually distinct. Of course, any of the users, in the examples given above, can switch between being either of the two kinds of user, depending upon the work that is being done at a particular moment.

To address the conflicting requirements, the example embodiments of the present invention provide various methods for automatically displaying the peak detect data samples in the background in either "quiet" or "loud" peak detect modes. The oscilloscope uses quiet peak detect when filtering is off, and loud peak detect when filtering is on. Preferably, the oscilloscope switches between these two modes of operation automatically, rather than forcing the user to independently choose a display method.

In FIG. 3, the waveform is shown in "quiet" peak detect mode. Preferably, this is the oscilloscope's default mode of operation. In this mode, pixels associated with the peak detect data samples 310 are drawn using a same hue as pixels associated with the unfiltered data 320. In addition, the pixels associated with the peak detect data samples 310 can be drawn with an intensity that substantially matches the intensity of the dimmest pixel from among the pixels associated with the unfiltered data 320 when the user selects the unfiltered data 320. "Substantially matches" means that the intensity is similar to or the same as, but need not be an exact match. The "fuzz" and "spikes" around the waveform are either from the peak detect data samples 310 displayed in the background, or from the unfiltered data 320 in the foreground. In the quiet peak detect mode of operation, two overlaid waveforms (i.e., associated with the peak detect data samples and the unfiltered data) can appear as one seamless waveform. Even though the user may be unable to tell which is which, such differentiation does not matter in this mode.

It should be understood that while the data 320 is referred to as "unfiltered," the data 320 can nevertheless be compressed using, for example, the decimator circuit (e.g., 220 and 260 of FIG. 2) described above. As used herein, the terms "filtered" and "unfiltered" refer to whether, or how much, lowpass filtering is applied to the electrical signal using, for example, lowpass filters 225 or 265 (of FIG. 2). The portion 340 of the waveform will be described in more detail below.

In FIG. 4, the waveform is shown in "loud" peak detect mode. This mode is used whenever the foreground waveform 420 is filtered. The loud peak detect mode shows pixels associated with the peak detect data samples 410 in a different hue (i.e., color) and/or intensity (i.e., brightness) from those used to display pixels associated with the filtered data samples 420 shown as the foreground waveform. That is, the loud peak detect mode pixels are shown having a hue that is shifted slightly from the hue of the foreground waveform, giving it a similar, but distinct, appearance. Additional details regarding the shifting of hues are given below with reference to FIGS. 6-8. This makes it easy for the user to distinguish the two waveforms. In areas of the screen in which the peak detect data samples forming the background waveform 410 are within a distance of a few pixels from the foreground waveform 420, the intensity of the background waveform is dimmed, in that area only, to further enhance the contrast. That is, a "guard band" or "trench" 430 may be placed on either side of the foreground waveform 420 so that the user can more easily see the foreground waveform.

Once again, note that the foreground waveform 320 in FIG. 3 is unfiltered, whereas the foreground waveform 420 of FIG. 4 is filtered. When filtering is off, the waveform style selector 142 (of FIG. 1) may display waveforms using the quiet peak detect mode. Conversely, when filtering is on, the waveform style selector 142 may display waveforms using the loud peak detect mode.

For example, the pixels associated with the peak detect data samples 410 that are proximally located to pixels associated with the filtered data samples 420 may be dimmed responsive to the location of the corresponding lowpass filtered waveform image pixels. In other words, the resulting image will respond to user changes in the amount of lowpass filtering applied. As another example, the waveform style selector 142 of the processing circuits 130 (of FIG. 1) may automatically switch to a first waveform display style 300 having the peak detect data samples 310 configured in a first mode when the user selects the unfiltered data 320. The user may select the unfiltered data 320 by adjusting an input of the oscilloscope 100, the input of which may use, for example, the I/O circuits 126 (of FIG. 1). Similarly, the waveform style selector 142 of the processing circuits 130 (of FIG. 1) may automatically switch to a second waveform display style 400 having the peak detect data samples 410 configured in a second mode when the user selects the filtered data 420. Again, the user may select the filtered data 420 by adjusting an input of the oscilloscope 100, the input of which may use, for example, the I/O circuits 126 (of FIG. 1).

By switching display styles, the oscilloscope 100 shows the waveform in the way that is most useful to the user. The user does not need to take additional action to adjust the display style to be suitable.

Figure 5:
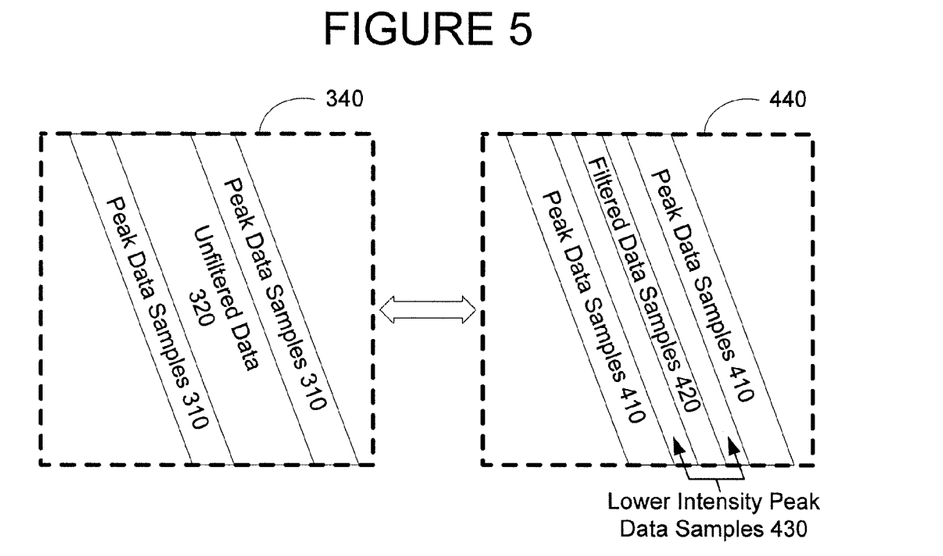
FIG. 5 shows portions of the waveforms from the example plots of FIGS. 3 and 4.

FIG. 5 shows portions 340 and 440 of the waveforms from the example plots of FIGS. 3 and 4 according to one embodiment. In the portion 340, the waveforms include unfiltered data 320 shown in the foreground with the peak data samples 310 next to the unfiltered data 320, which are in the background. This corresponds to the "quiet" peak detect mode as described above. In the portion 440, the waveforms have transitioned to the "loud" peak detect mode responsive to the user selecting the filtered data samples 420 for display on the display device 140 (of FIG. 1). The waveforms in this portion include the filtered data samples 420 and lower intensity peak data samples 430 forming the "guard bands" or "trenches" between the filtered data samples 420 and the peak data samples 410. For example, the peak detect data samples 410 that are within a distance of a few pixels from the filtered data samples 420, or otherwise proximally located to the filtered data samples 420, may be dimmed in that area only, to further enhance the contrast between the filtered data samples 420 and the peak detect data samples 410. In other words, the appearance of a graphic waveform image associated with the peak detect data samples 430 can possibly be changed when the user adjusts the lowpass filtering scheme of a sampled data stream, reflecting changes in the underlying filtered waveform data.

Figure 6:
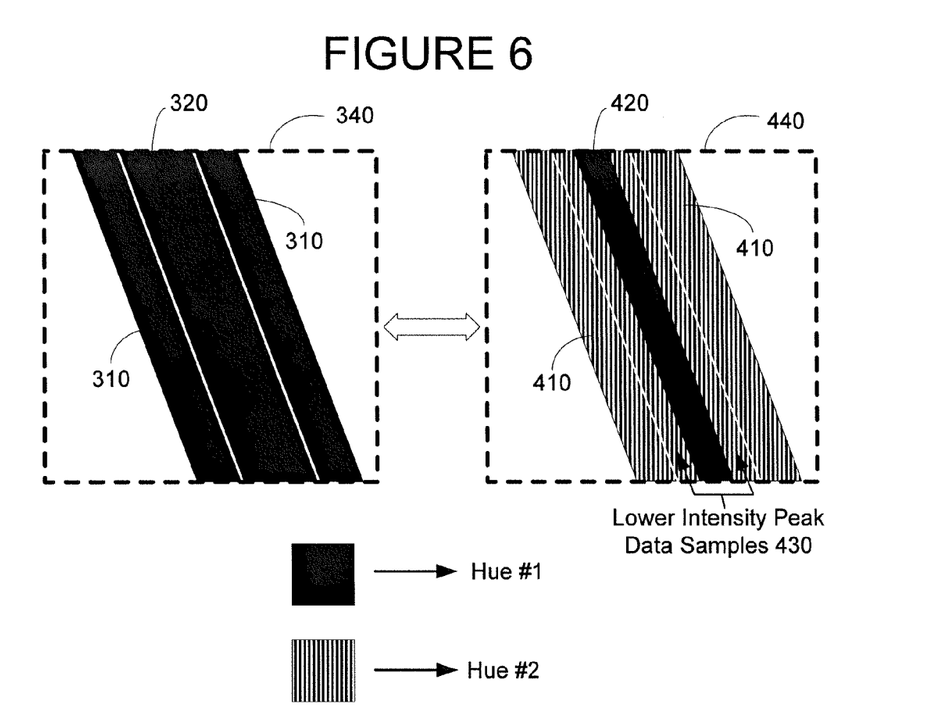
FIG. 6 shows portions of the waveforms from the example plots of FIGS. 3 and 4.

FIG. 6 shows portions 340 and 440 of the waveforms from the example plots of FIGS. 3 and 4 according to another embodiment. The portion 340 includes waveforms having the unfiltered data 320 and the peak data samples 310 in the "quiet" peak detect mode. In this embodiment, the uniform hue #1 is applied to both the unfiltered data 320 and the peak data samples 310. The portion 440 includes waveforms having the filtered data samples 420, the lower intensity peak data samples 430 forming the "guard bands" or "trenches" about the filtered data samples 420, and the peak detect data samples 410 in the "loud" peak detect mode. After (or while) transitioning to the loud peak detect mode, a second hue #2 is applied to only the peak detect data samples 410, including the lower intensity peak data samples 430. In other words, a hue of the pixels associated with the peak detect data samples 410 may be changed when the user of the oscilloscope 100 selects the filtered data samples 420 for display, or when the user of the oscilloscope 100 selects the unfiltered data 320 for display.

The result is that the loud peak detect mode is automatically engaged and provides waveforms primarily showing the underlying filtered signal, absent the noise, while the peak detected data samples show primarily the peaks of the noise. The displayed waveforms allow the user to see a signal having a bright intensity and suitable hue in the foreground, and to see the noise in a dimmer intensity and secondary hue in the background. While FIG. 6 shows that pixels associated with the unfiltered data 320 and the filtered data samples 420 are of the same hue, in an alternative embodiment, pixels associated with the unfiltered data 320 are displayed having a hue and intensity that are different from the pixels associated with the filtered data samples 420.

Regarding the hues #1 and #2, these may be selected from a color wheel rotation so that they are most pleasing to the eye. The color wheel (not shown), as used herein, refers to an organization of color hues around a circle, having relationships between at least colors considered to be primary colors and secondary colors, as is known in the prior art.

Preferably, the hue #1 is selected from a group comprising yellow, cyan, magenta, and green. These colors are preferred because the human eye can more easily perceive them. The hue #2 can be shifted by about 30 degrees on the color wheel rotation from the hue #1.

For example, if yellow at about 60 degrees on the color wheel is selected for hue #1, then hue #2 will preferably correspond to orange at about 30 degrees on the color wheel. If cyan at about 180 degrees on the color wheel is selected for hue #1, then hue #2 will preferably correspond to sky blue at about 210 degrees on the color wheel. If magenta at about 300 degrees on the color wheel is selected for hue #1, then hue #2 will preferably correspond to light purple at about 270 degrees on the color wheel. If green at about 120 degrees on the color wheel is selected for hue #1, then hue #2 will preferably correspond to mustard at about 90 degrees on the color wheel.

As previously mentioned, the oscilloscope 100 can have multiple channels. If, for example, the oscilloscope 100 has four channels, each of the channels can have associated therewith one of the hues selected from the group comprising yellow, cyan, magenta, and green. Further, the peak detect data samples for each of the channels may be stored to the one or more memory devices of the oscilloscope, along with the filtered data samples or unfiltered data for each of the channels. Then, for a given channel, the oscilloscope can display pixels having a first hue (e.g., yellow, cyan, magenta, or green) and first intensity that are associated with the filtered data samples or unfiltered data, and can display pixels having a second hue (e.g., orange, sky blue, light purple, or mustard) and second intensity that are associated with the peak detect data samples when the user selects the filtered data samples for the given channel. Generally, the second intensity will be dimmer than the first intensity, at least for some of the pixels, because the second intensity may correspond to the "guard bands" or "trenches." Similar hue and intensity configurations can be applied for each of the channels.

Figure 7:
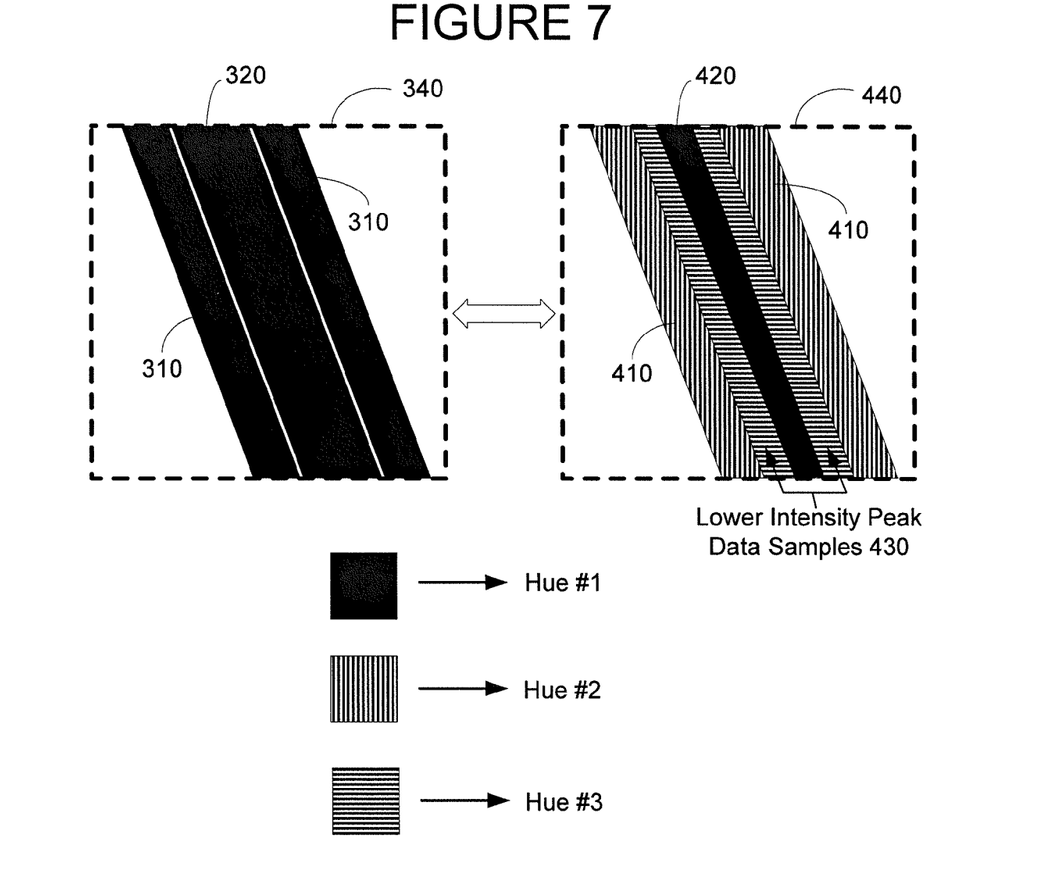
FIG. 7 shows portions of the waveforms from the example plots of FIGS. 3 and 4.

FIG. 7 shows portions 340 and 440 of the waveforms from the example plots of FIGS. 3 and 4 according to yet another embodiment. These portions are similar to those discussed above; therefore, for the sake of brevity, a detailed description will be omitted. However, it should be noted that in this embodiment, three different hues may be used to differentiate the different elements of the waveforms. For example, in portion 440, hue #1 may be applied to the filtered data samples 420, hue #3 may be applied to the lower intensity peak data samples 430 that are proximally located to pixels associated with the filtered data samples 420 when the user selects the filtered data samples 420 for display, and hue #2 may be applied to the peak data samples 410 that are more distantly located to pixels associated with the filtered data samples 420 than the proximally located pixels 430 when the user selects the filtered data samples 420 for display. Hues #1, #2 and #3 can correspond to any hues and need not correspond to hue #1 and hue #2 of FIG. 6.

Figure 8:
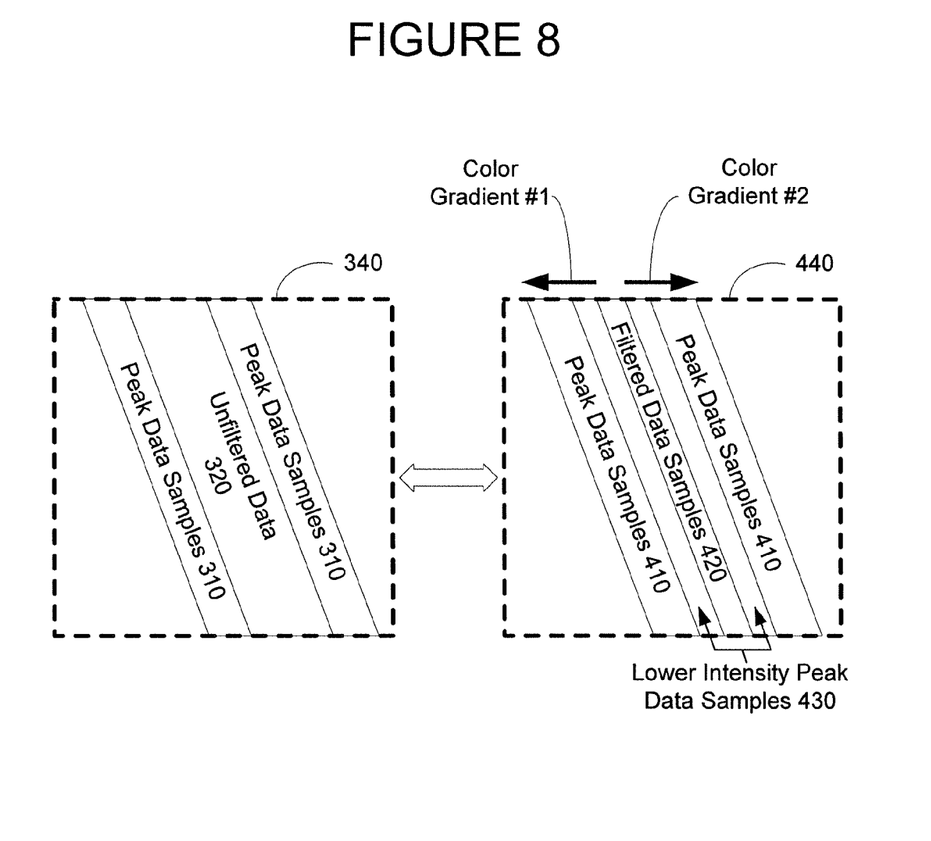
FIG. 8 shows portions of the waveforms from the example plots of FIGS. 3 and 4.

FIG. 8 shows portions 340 and 440 of the waveforms from the example plots of FIGS. 3 and 4 according to still another embodiment. These portions are also similar to those discussed above; therefore, for the sake of brevity, a detailed description will be omitted. Here, it should be noted, however, that gradients of colors may be applied to the waveforms. For example, color gradient #1 may be applied to the peak data samples 410 extending outwardly from the pixels associated with the filtered data samples 420 when the user selects the filtered data samples 420 for display. Similarly, color gradient #2 may be applied in a similar fashion, but extending outwardly in the opposite direction.

Figure 9:
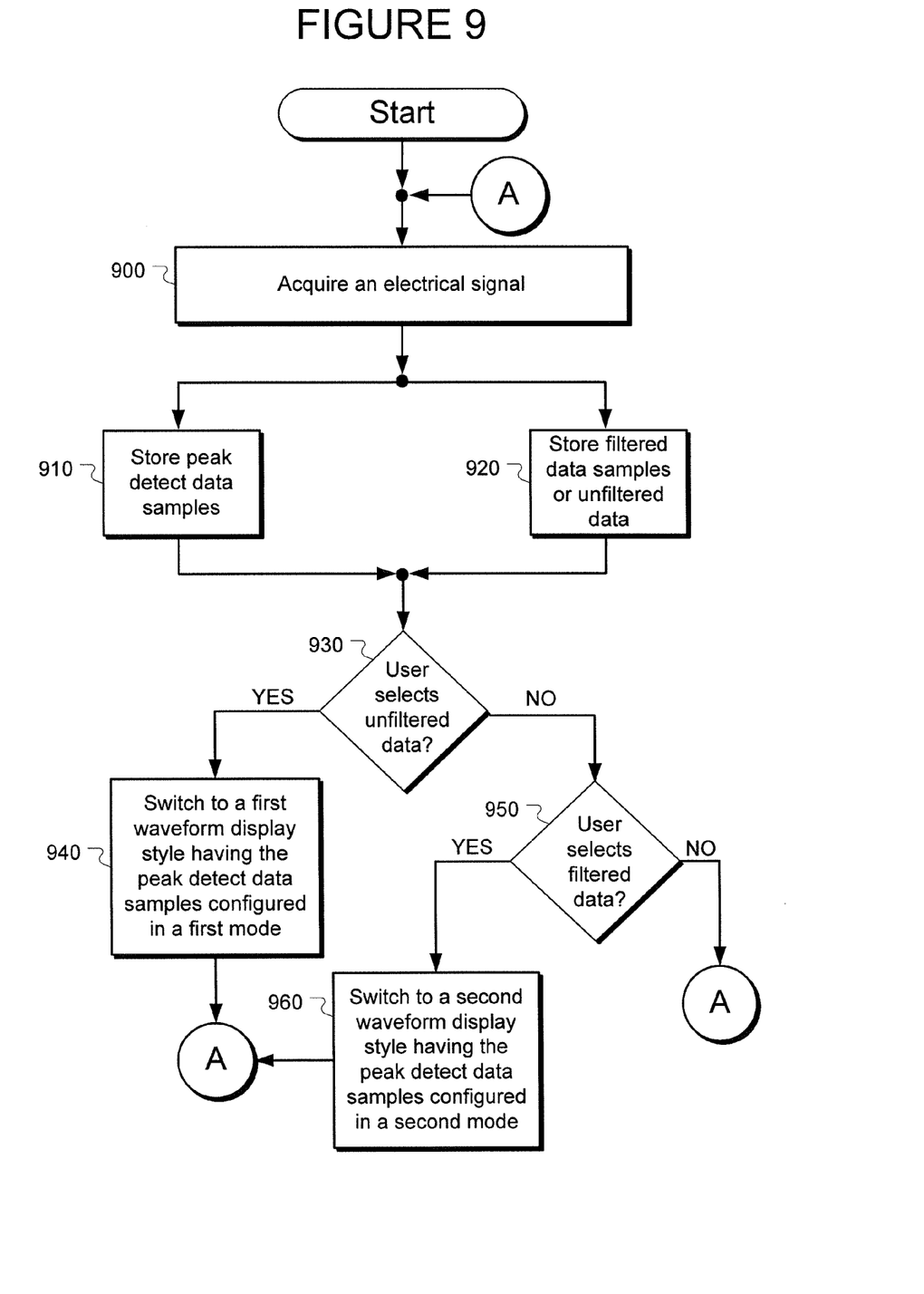
FIG. 9 is a flowchart illustrating a technique of switching waveform display styles on a test and measurement instrument of FIG. 1.

FIG. 9 is a flowchart illustrating a technique of switching waveform display styles on an oscilloscope according to some embodiments. The procedure may begin by acquiring an electrical signal at 900. The electrical signal may then be processed. For example, peak detect data samples and filtered data samples and/or unfiltered data may be simultaneously generated at 910 and 920 from the acquired electrical signal. At 930, the user may adjust an input of the oscilloscope to select unfiltered data. If the user indeed selects unfiltered data for display at 930, the flow proceeds to 940 and the display is switched to a first waveform display style having the peak detect data samples configured in a first mode. Otherwise, if the user selects filtered data at 950, the display is switched to a second waveform display style having the peak detect data samples configured in a second mode. In either case, the flow continues through 'A' such that the oscilloscope continues to acquire an electrical signal, to store peak detect data samples and filtered data samples and/or unfiltered data, and to monitor the input of the oscilloscope for selection by the user of filtered or unfiltered data for display. As described thoroughly above, the appearance of the peak detect data samples is automatically adjusted according to the selection of the user of filtered data samples and/or unfiltered data.

Although particular embodiments have been described, it will be appreciated that the principles of the invention are not limited to those embodiments. Variations and modifications may be made without departing from the principles of the invention as set forth in the following claims.

What is claimed is:

1. A method of switching waveform display styles on a digital oscilloscope having a visual display, comprising:
   acquiring an analog electrical signal;
   converting the analog electrical signal to a digital electrical signal;
   storing peak detect digital data samples from the digital electrical signal to one or more memory devices of the test and measurement instrument;
   storing one or both of filtered data samples and unfiltered data samples from the digital electrical signal to the one or more memory devices, wherein the filtered data samples are produced by lowpass filtering to remove a high frequency component of the digital electrical signal;
   displaying a waveform of the digital electrical signal;
   automatically switching the visual display to a first waveform display style in which the peak detect data samples are configured in a first mode when a user selects the unfiltered data; and
   automatically switching the visual display to a second waveform display style in which the peak detect data samples are configured in a second mode when the user selects the filtered data samples wherein the second waveform display style displays a combined waveform in which the peak detect digital data samples are overlaid with the lowpass filtered data samples with changing an intensity of pixels associated with the peak detect digital data samples based on the proximity to pixels associated with the lowpass filtered data samples.

2. The method of switching waveform display styles according to claim 1, wherein switching to the second waveform display style having the peak detect data samples configured in the second mode includes changing a hue of pixels associated with the peak detect data samples when the user selects the filtered data samples.

3. The method of switching waveform display styles according to claim 1, wherein switching to the second waveform display style having the peak detect data samples configured in the second mode includes changing an intensity of pixels associated with the peak detect data samples when the user selects the filtered data samples.

4. The method of switching waveform display styles according to claim 1, wherein switching to the second waveform display style having the peak detect data samples configured in the second mode includes dimming pixels associated with the peak detect data samples that are proximally located to pixels associated with the filtered data samples when the user selects the filtered data samples.

5. The method of switching waveform display styles according to claim 1, wherein switching to the second waveform display style having the peak detect data samples configured in the second mode includes:
   applying a first hue to pixels associated with the peak detect data samples that are proximally located to pixels associated with the filtered data samples when the user selects the filtered data samples; and
   applying a second hue to pixels associated with the peak detect data samples that are more distantly located to pixels associated with the filtered data samples than the proximally located pixels when the user selects the filtered data samples.

6. The method of switching waveform display styles according to claim 1, wherein switching to the first waveform display style having the peak detect data samples configured in the first mode includes changing an intensity of pixels associated with the peak detect data samples to substantially match a dimmest pixel from among pixels associated with the unfiltered data when the user selects the unfiltered data.

7. The method of switching waveform display styles according to claim 1, wherein the filtered data samples include lowpass filtered data samples.

8. The method of switching waveform display styles according to claim 1, wherein the filtered data samples include decimated data samples.

9. The method of switching waveform display styles according to claim 1, wherein the unfiltered data includes decimated data samples.

10. The method of switching waveform display styles according to claim 1, wherein the peak detect data samples include compressed data samples.

11. The method of switching waveform display styles according to claim 1, further comprising changing an intensity of pixels associated with the peak detect data samples that are proximally located to pixels associated with the filtered data samples responsive to the user changing an amount of lowpass filtering applied to the electrical signal, reflecting changes in the filtered data samples.

* * * * *